(12) United States Patent
Oh

(10) Patent No.: US 8,593,312 B2
(45) Date of Patent: Nov. 26, 2013

(54) METHOD AND APPARATUS FOR COMPRESSING AND DECOMPRESSING BLOCK UNIT DATA

(75) Inventor: Yun-Sik Oh, Seoul (KR)

(73) Assignee: Estsoft Corp., Seoul (KR)

(*) Notice: Subject to any disclaimer, the term of this patent is extended or adjusted under 35 U.S.C. 154(b) by 0 days.

(21) Appl. No.: 13/380,751

(22) PCT Filed: Aug. 25, 2010

(86) PCT No.: PCT/KR2010/005717
§ 371 (c)(1),
(2), (4) Date: Dec. 23, 2011

(87) PCT Pub. No.: WO2011/027989
PCT Pub. Date: Mar. 10, 2011

(65) Prior Publication Data
US 2012/0268298 A1    Oct. 25, 2012

(30) Foreign Application Priority Data
Sep. 4, 2009 (KR) ................. 10-2009-0083387

(51) Int. Cl.
*H03M 7/30* (2006.01)
(52) U.S. Cl.
USPC ..................... 341/87; 341/51; 382/232
(58) Field of Classification Search
USPC ............ 341/50, 51, 106, 67, 65, 87; 382/232, 382/233, 236
See application file for complete search history.

(56) References Cited

U.S. PATENT DOCUMENTS

| | | | |
|---|---|---|---|
| 5,455,629 A | 10/1995 | Sun et al. | |
| 5,579,316 A | 11/1996 | Venters et al. | |
| 5,873,097 A | 2/1999 | Harris et al. | |
| 5,915,094 A | 6/1999 | Kouloheris et al. | |
| 6,081,262 A | 6/2000 | Gill et al. | |
| 6,091,772 A | 7/2000 | Anderson et al. | |
| 6,148,429 A * | 11/2000 | Tatsuta .................. | 714/763 |
| 6,657,562 B2 * | 12/2003 | Radermacher et al. ......... | 341/50 |

(Continued)

FOREIGN PATENT DOCUMENTS

| | | |
|---|---|---|
| JP | 04359315 | 12/1992 |
| JP | 05313904 | 11/1993 |

(Continued)

OTHER PUBLICATIONS

Non-final Office Action for U.S. Appl. No. 13/380,734, dated Jan. 16, 2013.

(Continued)

*Primary Examiner* — Peguy Jean Pierre
(74) *Attorney, Agent, or Firm* — Greenberg Traurig, LLP

(57) ABSTRACT

An apparatus for compressing and decompressing data is disclosed. The apparatus for compressing data includes a block setting unit that divides data of at least one original file into two or more blocks, a compression unit that generates block compression data by applying a compression algorithm to data corresponding to at least one block among blocks divided by the block setting unit, and a compression file generation unit that generates a block header and the block body of the block for each block divided by the block setting unit, in which the block body includes the block compression data if the block is compressed by the compression unit or includes the original data of the block if the block is not compressed the by compression unit.

16 Claims, 3 Drawing Sheets

(56) References Cited

U.S. PATENT DOCUMENTS

| | | | |
|---|---|---|---|
| 6,750,918 | B2 | 6/2004 | Aneja et al. |
| 7,058,783 | B2 * | 6/2006 | Chandrasekaran et al. .. 711/171 |
| 7,158,518 | B2 | 1/2007 | Burmeister et al. |
| 7,362,780 | B2 | 4/2008 | Liu |
| 7,739,465 | B2 * | 6/2010 | Kameyama et al. .......... 711/162 |
| 7,940,990 | B2 * | 5/2011 | Yamada et al. ................ 382/232 |
| 8,175,396 | B2 * | 5/2012 | Song et al. .................... 382/232 |
| 2003/0108248 | A1 | 6/2003 | Huang et al. |
| 2003/0227392 | A1 | 12/2003 | Ebert et al. |
| 2005/0083934 | A1 | 4/2005 | Tan et al. |
| 2005/0175249 | A1 | 8/2005 | Ferlitsch |
| 2005/0220110 | A1 | 10/2005 | Agarwal |
| 2005/0238008 | A1 | 10/2005 | Fraser |
| 2005/0243187 | A1 | 11/2005 | Watanabe et al. |
| 2007/0088674 | A1 | 4/2007 | Kawate et al. |
| 2007/0098016 | A1 | 5/2007 | Kapoor et al. |
| 2007/0109153 | A1 | 5/2007 | Ma et al. |
| 2008/0025298 | A1 | 1/2008 | Lev-Ran et al. |
| 2008/0037540 | A1 | 2/2008 | Ngo et al. |
| 2008/0310452 | A1 | 12/2008 | Vedantham et al. |
| 2009/0154460 | A1 | 6/2009 | Varela et al. |
| 2009/0268660 | A1 | 10/2009 | Agarwal |
| 2009/0268667 | A1 | 10/2009 | Gandham et al. |
| 2009/0284400 | A1 | 11/2009 | Gui et al. |
| 2011/0200048 | A1 | 8/2011 | Thi |
| 2012/0177064 | A1 | 7/2012 | Shi et al. |
| 2012/0271802 | A1 | 10/2012 | Oh |

FOREIGN PATENT DOCUMENTS

| | | |
|---|---|---|
| JP | 2003299016 | 10/2003 |
| JP | 2006031012 | 2/2006 |
| JP | 2007043595 | 2/2007 |
| JP | 200988949 | 4/2009 |
| KR | 20030021345 A | 3/2003 |
| KR | 20040038271 A | 5/2004 |
| KR | 20040104831 | 12/2004 |
| KR | 10-0597513 | 6/2006 |
| KR | 20090044077 | 5/2009 |
| KR | 20090068787 A | 6/2009 |

OTHER PUBLICATIONS

International Search Report in connection with International Application No. PCT/KR2010/005882.

Written Opinion and International Preliminary Report on Patentability in connection with International Application No. PCT/KR2010/005882.

Office Action issued in connection with Japanese Patent Application No. 2012-522771.

International Search Report and Written Opinion in connection with International Application No. PCT/KR2010/005717.

International Preliminary Report on Patentability in connection with International Application No. PCT/KR2010/005717.

Asthana et al., "A Memory Participative Architecture for High Performance Communication Systems", 1994 IEEE, INFOCOM '94, Network Global Communications., 13th Proceedings IEEE, Jun. 12-16, 1994, (pp. 167-174).

Tye et al., "A Review of IP Packet Compression Techniques", Electronics Research Group, Department of Engineering, Aberdeen University, Scotland AB24 3UE, 2003, Proceedings of Post Graduate Networking Conference (pp. 1-6).

CAD & CG Magazine, vol. 1, No. 4, p. 68-72, Sep. 1, 1999 (6 pages).

C Magazine, vol. 3, No. 1, P. 59-68, Jan. 1, 1991 (11 pages).

Office Action issued on Jun. 28, 2013 in connection with Japanese Patent Application No. 2012-522770, with its English-language translation (6 pages).

* cited by examiner

Fig. 1

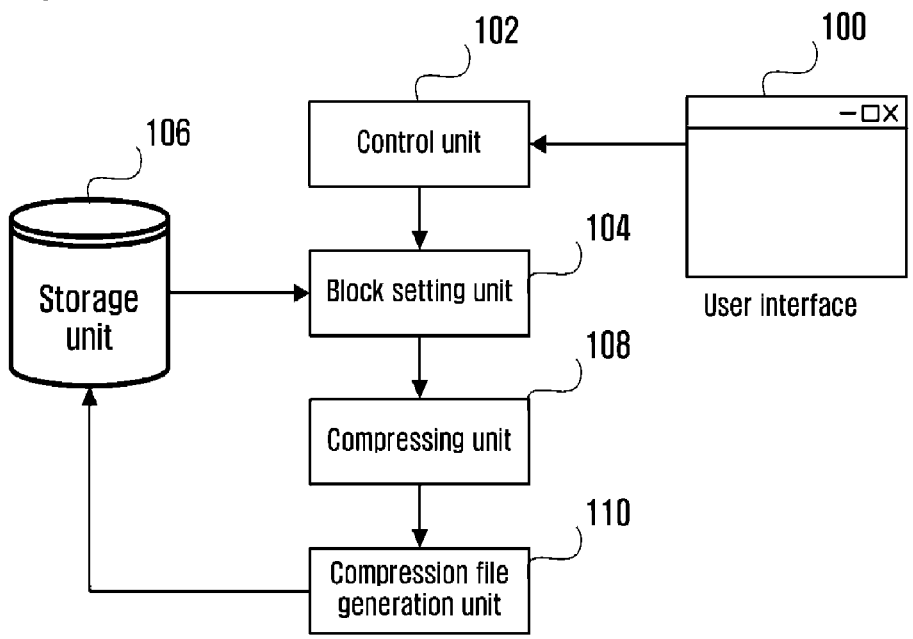

Fig. 2

| Compression file header(200) | 1 | |
|---|---|---|
| Compression file header extension field(202)<br>[divisional compression information,<br>solid compression information,<br>extension field termination code] | 1 | |
| Original file header(204) | 1 | 0~number of original files |
| ORiginal file header extension field(206)<br>[Original file path,<br>comments,<br>OS File system based file information,<br>encryption information,<br>extension field termination code] | 1 | |
| Block header(208) | 1 | 0~number of blocks |
| Block header extension field(210)<br>[comments,<br>Extension field termination code] | 1 | |
| Block body(212) | 1 | |
| Termination extension field(214)<br>[comments,<br>Extension field termination code] | | 1 |

Fig. 3

| Block header identification code | 4 bytes | 0x02B50C13 | |
|---|---|---|---|
| Compression algorithm | 2 bytes | 0 byte | Identification code |
| | | 1 byte | Hint |
| Data size before compression | 4 bytes | Block size before compression | |
| Data size after compression | 4 bytes | Block size after compression | |
| CRC32 | 4 bytes | CRC value of the block | |

Fig. 4

| Original file header identification code | 4 | 0x0A8590E3 |
|---|---|---|
| Identification information of original file within compression file | 4 | Unique value is set for each original file |
| File length | 8 | Total size of original file |

Fig. 5

| Original file path identification code | 4 bytes | 0x0a8591AC | | |
|---|---|---|---|---|
| Bit flag | 1 byte | bit | Unset | Set |
| | | 3 | Not compressed | Compressed |
| | | 4 | Use Unicode | Use code page |
| | | 5 | Absolute path | Relative path |
| size | 2 bytes | | | |
| Code page | 0 or 2 byte | CODE PAGE MAY BE DESIGNATED WHEN UNICODE IS NOT USED EX) 0: DEPEND ON SYSTEM SCALE 932: Japanese (Shift-JIS) 949: Korean | | |
| Parent path ID | 0 or 4 | IT EXISTS ONLY WHEN FIFTH FLAG OF BIT FLAG IS SET, AND IS IDENTIFICATION INFORMATION WITHIN ORIGINAL FILE HAVING PARENT PATH. | | |
| ORIGINAL FILE PATH STRING | | STRING THAT EXPRESSES ORIGINAL FILE PATH | | |

METHOD AND APPARATUS FOR COMPRESSING AND DECOMPRESSING BLOCK UNIT DATA

CROSS-REFERENCE TO RELATED APPLICATIONS

The present application is a U.S. national-phase application of International Application No. PCT/KR2010/005717 filed Aug. 25, 2010, which claims priority to Korean Patent Application No. 10-2009-0083387 filed Sep. 4, 2009.

TECHNICAL FIELD

The present invention relates to a method and apparatus for compressing and decompressing block unit data. More specifically, the present invention relates to a method and apparatus for compressing data by blocks by dividing the original file into two or more blocks or restoring the compressed data.

BACKGROUND ART

Data compression technology is a technology that reduces transmission time or saves memory space by removing unnecessary portions when transmitting or inputting data. For example, if the document is transmitted by fax, it takes time to send space between letters and space between lines together, so transmission time is reduced by data compression by transmitting data using simplified signals of the space portion or simplifying the repeated data. When magnetic tapes or disks are used for inputting data, the technology saves the memory.

In compressing data, a technology of generating compressed data including information for identifying the type of the compression algorithm after applying a certain compression algorithm to the original data is widely used. It is common for the original data to be saved in file units, the file system storage unit of a computer system. That is, after one or more files are specified, the compression algorithm is specified for compression. It is possible to specify different compression algorithms for the specified files.

Further, in some file types, compression of data of certain portions are meaningless because they have been already compressed. Also, there are situations when optimal compression algorithms are different for different portions of one file. However, even in such a case, only one compression algorithm can be used for one file, so it is impossible to apply different algorithms for different portions inside the file.

Also, in the case of some compression algorithms, the maximum data length that can be compressed is limited, thereby making it impossible for some large-size data to be compressed. For example, in compression algorithms where the data length for compression should be less than 4 Giga bytes, it is impossible for data larger than 4 Giga bytes to be compressed.

DISCLOSURE OF INVENTION

Technical Problem

It is an object of the present invention to provide an apparatus and method for compressing data, which divides one file into two or more blocks and compresses data for each block, and generates a compression file that includes a block header and a block body including compression information such as identification information of a compression algorithm applied to the block.

It is another object of the present invention to provide an apparatus and method for restoring compression data, which loads a block header and a block body for each block, parses them for each block, and restores compression using the compression algorithm corresponding to compression information of the block body included in each block header.

It is another object of the present invention to an apparatus and method for restoring compression data, which prevents a damage of a file path when compression is restored by including a method the file path type of the original file is encoded in the original file header for each original file included in a compression file.

Additional advantages, objects, and features of the invention will be set forth in part in the description which follows and in part will become apparent to those having ordinary skill in the art upon examination of the following or may be learned from practice of the invention.

Solution to Problem

According to an exemplary embodiment of the present invention, there is provided an apparatus for compressing data including a block setting unit that divides data of at least one original file into two or more blocks, a compression unit that generates block compression data by applying a compression algorithm to data corresponding to at least one block among blocks divided by the block setting unit, and a compression file generation unit that generates a block header and the block body of the block for each block divided by the block setting unit, in which the block body includes the block compression data if the block is compressed by the compression unit or includes the original data of the block if the block is not compressed the by compression unit.

According to an exemplary embodiment of the present invention, there is provided an apparatus of restoring compression data including a compression file generation unit that loads the compression file including two or more block header pairs including a block body and information on the block body, and extracts the block body, a block compression restoration unit that restores compression of the block body that forms a pair with the block header using information on the block body included in the block header, and an original file generation unit that generates the original file by connecting the block body whose compression is restored by the block compression restoration unit.

According to an exemplary embodiment of the present invention, there is provided a method of compressing data including generating block compression data by dividing data of at least one original file into two or more blocks and applying a compression algorithm to data corresponding to at least one block among the divided blocks, and generating the compression file that includes the block header and the block body of the block for each divided block, in which the block body includes the block compression data if the block is compressed by the compression unit or includes the original data of the block if the block is not compressed by the compression unit.

According to an exemplary embodiment of the present invention, there is provided a method of restoring compression data including extracting a block header and a block body by loading the compression file including two or more block header pairs including the block body and information on the block body, and restoring compression of the block body that forms a pair with the block header using information on the block body included in the block header, and generating the original file by connecting each compression-restored block body.

According to an exemplary embodiment of the present invention, there is provided a computer-readable recording medium including functions of dividing data of at least one original file into two or more blocks, generating block compression data by applying a compression algorithm to data corresponding to at least one block among the blocks, and generating a compression file that includes the block header and the block body of the block for each divided block, in which the block body includes the block compression data if the block is compressed by the compression unit or includes the original data of the block if the block is not compressed by the compression unit.

According to an exemplary embodiment of the present invention, there is provided a computer-readable recording medium including the functions of extracting a block header and a block body by loading a compression file including two or more block header pairs including information on the block body and information on the block body, restoring compression of the block body that forms a pair with the block header using information on the block body included in the block header, and generating the original file by connecting each compression-restored block body.

Advantageous Effects of Invention

According to the present invention, encryption can be performed by selecting the most suitable encryption algorithm to each block of the file. Moreover, if encryption is needed to just some blocks of the file, encryption can be performed just to the block.

BRIEF DESCRIPTION OF DRAWINGS

FIG. 1 shows the configuration of a data compression apparatus according to an exemplary embodiment of the present invention.

FIG. 2 shows the configuration of a compression file that is generated by the data compression apparatus according to an exemplary embodiment of the present invention.

FIG. 3 shows an example of the configuration of a block header in the configuration of a compression file that is generated by a data compression apparatus according to an exemplary embodiment of the present invention.

FIG. 4 shows an example of the configuration of an original file header in the configuration of a compression file that is generated by a data compression apparatus according to an exemplary embodiment of the present invention.

FIG. 5 shows an example of the configuration of an original file path in the configuration of a compression file that is generated by a data compression apparatus according to an exemplary embodiment of the present invention.

MODE FOR THE INVENTION

Figure 6:
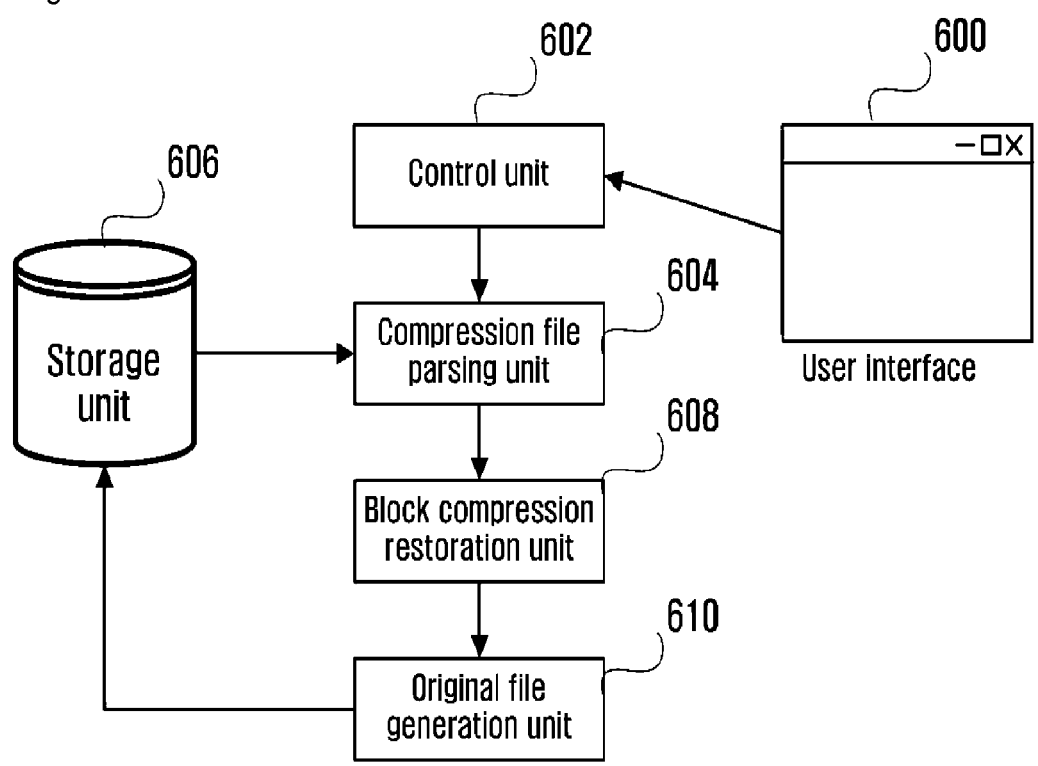
FIG. 6 shows the configuration of an apparatus for restoring compression data according to an exemplary embodiment of the present invention.

Hereinafter, the configuration and operation of a data compression apparatus according to an exemplary embodiment of the present invention will be explained with reference to FIG. 1. FIG. 1 shows the configuration of a data compression apparatus according to the embodiment. The apparatus for compressing data according to the present embodiment may be understood to mean the state in operation of a program that performs certain functions in a general computer system.

As shown in FIG. 1, an apparatus for compressing data according to the present embodiment includes a user interface 100, a control unit 102, a block setting unit 104, a storage unit 106, a compression unit 108 and a compression file generation unit 110.

The original file for compression is specified by the user of the apparatus for compressing data, and the user interface 100 provides the information of the original file to the control unit 102. Hereinafter, the original file is used as a term that indicates the data group, but should not be understood as the same as the file used as a data storage unit in a general computer system. That is, the original file means data to be compressed of one group. For example, the original file may be a file that is supported by an operating system, a file that is a storage unit of a file system or data that is temporarily stored in a memory.

The control unit 102 transmits information about the original file to the block setting unit 104. The control unit 102 may transmit more block setting information to the block setting unit 104. The block setting information may include block setting criteria.

The block setting unit 104 loads the original file from the storage unit 106, divides the original file data into more than two blocks. It is preferable that the block setting unit 104 loads the original file and divides the body data except the header data into two or more blocks.

The storage unit 106 stores compression files generated by the original file and the compression file generation unit 110. The storage unit 106 may be implemented by a non-volatile memory device such as Cache, ROM, PROM, EPROM, EEPROM and flash memory, a volatile memory device such as RAM, and a hard-disk drive, but is not limited to them. Also, FIG. 1 illustrates that the storage unit 106 is directly connected to the block setting unit and the compression file generation unit 110, but the storage unit 106 is separated from the data compression device according to the present invention and can be connected to the block setting unit 104 and the compression file generation unit 110.

The compression unit 108 applies compression algorithm for data corresponding to at least one block among blocks divided by the block setting unit 104 to generate block compression data. That is, it should be noticed that data of the original file may be partly compressed. For example, the block setting unit 104 divides the original file into three blocks, and the compression unit 108 compresses only the second block among the three blocks. Which blocks will be compressed can be specified by the block setting unit to be provided to the compression unit 108, and the compression may be done only for blocks whose compression efficiency is higher than the benchmark. The compression efficiency can be set to the data size after compression divided by the data size before compression.

To-be-compressed block information can be inputted through the user interface 100 and can be provided through the control unit 102 and the block setting unit 104. The to-be-compressed block information can include the start point offset of the block and the end point offset of the block.

The compression file generation unit 110 generates the compression file that includes the block header and the block body for each block divided by the block setting unit 104. Here, the block body includes the block compression data if the block has been compressed by the compression unit 108 and includes the original data of the block if the block $\overset{\text{\tiny H}}{\leftharpoonup}$ non been compressed by the compression unit 108.

The block header may include identification information of the compression algorithm when the flag meaning "not compressed" is set if the block body of the block is the original data of the block. Also, the block header may include the data size of the block body of the block before compression and the data size after compression. Compression algorithm that can compress only data maximum 4 bytes can be supported as the data size of the block body data before compression and the data size after compression become 4 bytes respectively.

The compression file includes as many original file headers including information on each original file as the number of the original files, and the original file header may include data that represent identification information within the compression file for the corresponding original file and the size of the corresponding original file.

Also, the compression file includes the original file header extension field that includes the additional information for the original file that is not included in the original file header, and the original file header extension field may include at least one set of data among the path of the original file, the comment for the original file, file information based on the operating file system, and the encryption information of the original file.

Here, the path data of the original file and the comment data for the original file may include at least one of the character-encoding information or information on whether encryption has been done.

Also, the path data of the original file may include the flag on whether the path of the original file has been written as the relative path or as the absolute path and the path of the original file and may include identification information within the compression file of the original file that can refer to the parent path if the path of the original file is written as the relative path.

Hereinafter, the configuration of the compression file generated by the compression file generation unit 110 and the operation of the data compression apparatus according to the present invention will be explained with reference FIG. 2. First, the configuration of the compression file generated by the compression file generation unit 110 is explained with reference to FIG. 2. FIG. 2 shows the configuration of the compression file generated by the data compression apparatus according to the present embodiment. However, it should be noted that the order of each configuration may be changed in analyzing FIG. 2. For example, in FIG. 2, the block header 208 is positioned in front of the block body 212, but it is possible for the block body 212 to be positioned in front of the block header 208. That is, FIG. 2 is just an example of the configuration of the compression file generated by the data compression apparatus according to the present embodiment.

As illustrated in FIG. 2, the compression file generated by the compression file generation unit 110 may include a compression file header 200 that includes information that can identify the format of the compression file, a compression file header extension file 202 that can include information on whether the compression file has been segmentation-compressed or solid-compressed, an original file header 204 that includes information for the original file included in the compression file, an original file header extension field 206 that includes additional information for the original file that is not included in the original file header 204, a block header 208 that includes the information for the block, a block header extension field 210 that may include additional information for the block, a block body 212 that includes the block data and a termination extension field 214 that includes the code that informs of the termination of the compression file or comments on the present compression file.

The following points should be noted in understanding FIG. 2. The compression file header extension field 202, the original file header extension field 206 and the block header extension field 210 refer to the area that writes down the related points that have not been written in the compression file header 200, the original file header 204 and the block header 208, respectively. Hence, the information that can be respectively included in the compression file header extension field 202, the original file header extension field 206 and the block header extension field 210 is not limited to what is illustrated in FIG. 2, and the data that is not illustrated in FIG. 2 is newly defined to be positioned in the corresponding area.

That is, the compression file header 200, the original file header 204, the block header 208, the block body 212, the segmentation compression information and solid compression information are data units having predefined configurations. The compression file header extension field 202, the original file header extension field 206, the block header extension field 210 and the termination extension field 214 are areas where the data units can be positioned.

However, it is desirable for the data units that can be positioned at each extension field 202, 206, 210 and 214 to be determined in advance. For example, a data unit, which is the segmentation compression information that can be included in the compression file header extension field 202, could be determined in advance not to be included in the original file header extension field 206. Also, each extension field 202, 206, 210 and 214 is not essential elements in constituting the compression file, so the compression file without an extension field 202, 206, 210 and 214 is possible.

The following should also be noted in understanding FIG. 2. The number illustrated in the right cell of each data element is the number of the corresponding data elements that can exist in the compression file.

For example, one original file header 204 can exist for each original file, so if the compression of the original compression file is restored within the compression file, the original file headers 204 as many as the number of the generated original files can exist. Also, each original file can be divided into one or more blocks, so the pairs of the block header 208 and the block body 212 connected to one original file header can exist as many as the number of blocks existing within the original file header. However, if the original file is a folder or a directory, the number of blocks of the original file is 0.

For example, assuming that the compression file includes three original files of X file, Y file and Z file, X file comprises A and B blocks, Y file comprises C, D and E blocks and Z file comprises F block, the compression file may be configured in the following order. Compression file header 200, X original file header 204, A block header 208, A block body 212, B block header 208, B block body 212, Y original file header 204, C block header 208, C block body 212, D block header 208, D block body 212, E block header 208, E block body 212, Z original file header 204, F block header 208, F block body 212.

The apparatus of compressing data according to the present invention divides one file into two or more blocks and selects the most appropriate compression algorithm for each block for compression. In the present embodiment, the compression unit 108 can compress A block using A algorithm and compress B block using B algorithm. That is, the compression file can be generated using different compression algorithms for data that belong to one original file. The identification information for the algorithm used in compression for each block can be included in the block header 208. An example of configuration of the block header 208 according to the present invention is illustrated in FIG. 3.

As illustrated in FIG. 3, the block header 208 includes information for the compression algorithm that is applied in compressing data of the block body 212 of the block. It should be noted that not only the identification code of the compression algorithm but also hint information for the compression algorithm may be included. The hint information may be suggested if the compression algorithm cannot be recognized when the compression file is restored.

Also, the apparatus of compressing data according to the present invention can compress data by specifying only the corresponding portion when the compression is necessary only for a portion of the file, and reversely, when restoring the compression file, only the compressed portion can be restored to generate the original file. In the present embodiment, the compression unit 108 can compress only D block among C, D and E blocks of Y file. Here, a flag meaning "not compressed" is set in the compression algorithm identification information included in the block header 208 of C block and E block. Also, C block and the block body 212 of E block would include data of the corresponding data of the original file.

If the original file is an image file such as JPEG (Joint Photograph Coding Experts Group), a portion of data is in a state compressed by JPEG Codec, so the compression effect would not be significant. In such a case, the compression on the entire file is not efficient, so it is efficient to compress only some blocks. Especially, in the case of a video file with the large data size, compressing only some blocks can reduce much time The compression apparatus according to the present embodiment divides the file that exceeds the data size supported by the compression algorithm into several blocks within the data size supported by the compression algorithm, and compresses data using the compression algorithm, thereby compressing large-capacity data using the same compression algorithm. For example, ZIP-type compression algorithm can compress and restore maximum 4 Gigabyte data. If there is an original file having 10 Gigabytes, for example, the apparatus for compressing data according to the present embodiment divides the original file into A block of 3 Gigabytes, B block of 3.5 Gigabytes and C block of 3.5 Gigabytes, and applies ZIP compression algorithm for each block for compression, by which large-capacity original files that exceed the possible size of compression can be compressed using the existing compression algorithm. Referring to the example of the configuration of an original file header 204 illustrated in FIG. 4, the original file header 204 within the compression file according to the present embodiment specifies the length field of the original file as 8 bytes, not 4 bytes, so the length can be set without loss for original files that exceed 4 Gigabytes.

Further, in the apparatus for compressing data according to the present invention, the language encoding method of the file path of the original file included in the compression file is included in the original file path data positioned in the original file header extension field 206, and when the compression file is restored, the file path is restored considering the language encoding method included in the file header data, so the damage when the file path restores the compression file can be prevented.

Referring to FIG. 2, the original file header extension field 206 may include data for the path of the original file and data for comments. How the apparatus for compressing data according to the present invention supports the multi-language of the file path and the file path setting function of the relative path method are explained with reference to the configuration of the original file path data illustrated in FIG. 5.

As illustrated in FIG. 5, the original file path data includes a bit flat that includes information on how the original file path has been encoded. FIG. 5 sets original file path data encryption, information on the encoding method and information on the use of the relative path according to whether a certain bit of a flag that occupies 1 byte is set or unset.

First, the path data of the original file may have been encrypted. In the case of FIG. 5, if the third bit of the bit flag is set, it means that the path data of the original file has been encrypted. If the path data of the original file has been encrypted, the path data of the original file can be decrypted with reference to encryption information that may be included in the original file header extension field 206.

Next, if the fourth bit of the bit flag is set, it means that the path data of the corresponding original file has been encoded by a certain code page. If the fourth bit of the bit flag is set, the code page is set in the code page field. If the fourth bit of the bit flag is unset, it means that the path data of the original file is encoded as Unicode or in UTF-8 method.

Next, the path data of the original file may have been set in a relative path method. For example, if the entire path of X file is "c:\\windows\data\movies\x", the absolute path is "c:\\windows\data\movies\x", but the relative path in the state of "c:\\windows\data\movies" is "\x". The path data designation of the relative path method gives high compression efficiency when the absolute path is long and many original files are stored in one directory. If the fifth bit of the bit flag is set, it means that the path data of the corresponding original file is the relative path, and the patent path is designated in Parent Path ID field. The value designated in the patent path ID field may be identification information of the original file within the compression file included in the original file header illustrated in FIG. 4. Hence, when the compression file whose original file path has been set in the relative path method is restored, the absolute path is generated by connecting the relative path to the path of the original file designated in the patent path ID field, and the original file is restored in the position of the absolute path.

Hereinafter, the configuration and operation of the restoration apparatus of compression data according to another exemplary embodiment of the present invention will be explained with reference FIG. 6. FIG. 6 shows the configuration of a restoration apparatus of compression data according to the present embodiment. The apparatus can restore compression files generated by the data compression apparatus. The compression data restoration apparatus can perform the function of the data compression apparatus by further including the configuration illustrated in FIG. 1.

As illustrated in FIG. 6, the restoration apparatus of compression data according to the present embodiment may include a user interface 600, a control unit 602, a compression file parsing unit 604, a storage unit 606, a block compression restoration unit 608 and an original file generation unit 610.

The user interface 600 receives the compression file designated by the user of the data compression apparatus, and provides the information of the compression file to the control unit 602.

The control unit 602 transmits the information on the compression file to the compression file parsing unit 604.

The compression file parsing unit 604 loads the compression file including two or more pairs of the block header including information on the block body and information on the block body, and extracts the block header and the block body.

The storage unit 606 stores the original file generated by the compression file and the original file generation unit 610.

The block compression restoration unit 608 restores the compression of the block body compression that forms a pair with the block header using information on the block body included in the block header. The block header includes information on the compression algorithm used in the compression of the block body, so the block compression restoration unit 608 can restore compression of the block body that forms a pair with the block header using the compression restoration algorithm corresponding to the compression algorithm according to identification information of the compression algorithm included in the block header.

If only a few blocks from at least one of the original files included in the compression file are compressed, that is, identification information of the compression algorithm included in at least one block header is a flag meaning "not compressed," the block compression restoration unit 608 can provide the block body to the original file generation unit.

The original file generation unit 610 connects the block body in which compression is restored by the block compression restoration unit, and generates the original file.

Hereinafter, the method of compressing data according to another exemplary embodiment of the present invention will be explained in the following. It should be noted that the method of compressing data according to the present embodiment may apply technical features of the data compression apparatus according to the above-explained embodiment of the present invention.

First, one or more original files are divided into two or more blocks.

Next, the compression algorithm is applied to data corresponding to one or more blocks among the divided blocks to generate the block compression data.

Next, the compression file that includes the block header and the block body of the block is generated for each divided block. Here, if the block is compressed by the compression unit, the block body includes the block compression data, and if the block is not compressed by the compression unit, it includes the original data. Also, it is desirable for the block header to include identification information of compression algorithm applied to the compression of the block body. Also, it is desirable for the information showing compression state of the block body to be included in the block header.

Hereinafter, the method of restoring compression data according to another embodiment of the present invention will be explained in the following. It should be noted that technical features of the compression data restoration apparatus according to another embodiment of the present invention may be applied to the method of restoring the compression data.

First, a compression file including two or more block header pairs including information on the block body and information on the block body is loaded.

Next, the block header and the block body are extracted from the loaded compression file.

Next, the compression of the block body that forms a pair with the block header is restored using information on the block body included in the block header. It is desirable for the information on the block body included in the block header to include identification information of the compression algorithm applied to the compression of the corresponding block body. Also, it is desirable for the block header to include information on whether the corresponding block body has been compressed. If the block header includes information on whether the corresponding block body has not been compressed, it is desirable for the restoration action of compression not to be performed for the data of the block body.

Next, the original file is generated by connecting each compression-restored block body. For example, in the case of the compression algorithm including A block compressed by X algorithm, non-compressed B block and C block compressed by Y algorithm, the original file can be generated by connecting A' that has restored A block using the compression restoration algorithm corresponding to X algorithm and C' that has restored C block using the compression restoration algorithm corresponding to Y algorithm with A'BC'.

Hereinafter, the computer-readable recording medium that records the program according to another embodiment of the present invention will be explained in the following. It should be noted that the above-explained technical features of the data compression apparatus and the compression data restoration apparatus can be applied.

The recording medium may be at least one of a non-volatile memory device such as Cache, ROM, PROM, EPROM, EEPROM and Flash memory, a volatile memory device such as RAM, and a storage medium such as a hard disk drive.

The computer-readable recording medium according to the present embodiment can perform the block setting function that divides at least one set of original data into two or more blocks, the function of generating the block compression data by applying compression algorithm to data corresponding to at least one block, and the function of generating the compression file that includes the block header and the block body of the block for each divided block. However, the block body is data that includes the block compression data when the corresponding block is compressed by the compression unit or data that includes the original data of the block when the corresponding block is not compressed by the compression unit.

The computer-readable medium that records the program according to the present embodiment may perform the function of extracting the block header and the block body by loading the compression file including two or more block header pairs including the block body and information on the block body, the function of restoring compression of the bock body that becomes a pair with the block header using information on the block body included in the block header, and the function of generating the original file by connecting each compression-restored block body.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

INDUSTRIAL APPLICABILITY

This invention improves the efficiency of the encryption of the file by performing the encryption by the block of the file.

The invention claimed is:

1. An apparatus for compressing data, the apparatus comprising:
a block setting unit that divides data of at least one original file into two or more blocks;
a compression unit that generates block compression data by applying a compression algorithm to data corresponding to at least one block among the blocks divided by the block setting unit; and
a compression file generation unit that generates a block header and a block body for each block divided by the block setting unit,
wherein the block body includes the block compression data if the each block is compressed by the compression unit or includes the original data of the each block if the each block is not compressed by the compression unit; and
wherein the compression file generates a compression file including an original file header extension field including additional information on the at least one original file that is not included in an original file header, and the original file header extension field includes a path of the at least one original file, comments on the at least one original file, and file information based on a file system of an operating system, and encryption information of the at least one original file.

2. The apparatus of claim 1, wherein the block header of the each block includes identification information of the compression algorithm applied to the compression of the block body of the each block.

3. The apparatus of claim 2, wherein the block header of the each block includes identification information of the compression algorithm where a flag meaning "not compressed" is set if the block body of the each block is the original data of the block.

4. The apparatus of claim 1, wherein the block header includes a data size of the block body of the each block before compression and the data size after compression.

5. The apparatus of claim 1, wherein the data that shows a data size of the block body of the each block before compression and the data size after compression has a four byte length, respectively.

6. The apparatus of claim 5, wherein the block setting unit divides the data of the at least one original file into the two or more blocks of less than 2 Gigabytes if the data size of the at least one original file exceeds 4 Gigabytes.

7. The apparatus of claim 1, wherein the compression file generation unit generates a compression file having original file headers including information on the at least one original file, the information comprising one or more of a number of files, and the file headers include data that shows identification information, and a size of the at least one original file.

8. The apparatus of claim 1, wherein the path of the at least one original file and the comments on the at least one original file include at least one of whether encrypted or not and letter encoding information.

9. The apparatus of claim 1, wherein the path of the at least one original file includes a flag on whether the path of the at least one original file is written as a relative path or an absolute path and identification information within the compression file of the at least one original file that can refer to the parent path if the path of the at least one original file is written as a relative path.

10. An apparatus of restoring compression data, the apparatus comprising:
a compression file generation unit that loads a compression file including two or more block header pairs including a block body and information on the block body, and extracts the block body;
a block compression restoration unit that restores compression of the block body that forms a pair with a first block header in the block header pairs using information on the block body included in the first block header; and
an original file generation unit that generates the original file by connecting the block body whose compression is restored by the block compression restoration unit.

11. The apparatus of claim 10, wherein the first block header includes identification information on a compression algorithm applied to compression of the block body, and the block compression restoration unit restores compression of the block body that forms a pair with the first block header using a compression restoration algorithm corresponding to the compression algorithm according to identification information of the compression algorithm included in the first block header.

12. The apparatus of claim 11, wherein the block compression restoration unit provides the block body itself that forms a pair with the first block header to the original file generation unit if the identification information of the compression algorithm included in the first block header is a flag that means that the identification information has not been compressed.

13. A method of compressing data, the method comprising:
generating block compression data by dividing data of at least one original file into two or more blocks and applying a compression algorithm to data corresponding to at least one block among the divided blocks; and
generating a compression file that includes a block header and a block body of a block in the divided blocks, wherein the block body includes the block compression data if the block is compressed by the compression unit or includes the original data of the block if the block is not compressed by the compression units,
wherein the compression file includes an original file header extension field including additional information on the at least one original file that is not included in an original file header, and the original file header extension field includes a path of the at least one original file, comments on the at least one original file, and file information based on a file system of an operating system, and encryption information of the at least one original file.

14. A method of restoring compression data, the method comprising:
extracting a block header and a block body by loading a compression file including two or more block header pairs including the block body and information on the block body, and restoring compression of the block body that forms a pair with a first block header in the block header pairs using information on the block body included in the first block header; and
generating the original file by connecting each compression-restored block body.

15. A non-transitory computer-readable recording medium including functions of:
dividing data of at least one original file into two or more blocks;
generating block compression data by applying a compression algorithm to data corresponding to at least one block among the blocks; and
generating a compression file that includes a block header and a block body for each divided block, wherein the block body includes the block compression data if the each divided block is compressed by the compression unit or includes the original data of the each divided block if the each divided block is not compressed by the compression units,
wherein the compression file includes an original file header extension field including additional information on the at least one original file that is not included in an original file header, and the original file header extension field includes a path of the at least one original file, comments on the at least one original file, and file information based on a file system of an operating system, and encryption information of the at least one original file.

16. A non-transitory computer-readable recording medium including the functions of:
extracting a block header and a block body by loading a compression file including two or more block header pairs including information on the block body;
restoring compression of the block body that forms a pair with a first block header in the block header pairs using information on the block body included in the first block header; and generating the original file by connecting each compression-restored block body.

* * * * *